United States Patent
Kitagawa et al.

(10) Patent No.: US 6,506,251 B1
(45) Date of Patent: Jan. 14, 2003

(54) METHOD FOR PRODUCING SILICON SINGLE CRYSTAL

(75) Inventors: Koji Kitagawa, Fukushima (JP); Susumu Sonokawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 26 days.

(21) Appl. No.: 09/959,302
(22) PCT Filed: Feb. 21, 2001
(86) PCT No.: PCT/JP01/01224
§ 371 (c)(1), (2), (4) Date: Oct. 23, 2001
(87) PCT Pub. No.: WO01/63026
PCT Pub. Date: Aug. 30, 2001

(30) Foreign Application Priority Data

Feb. 25, 2000 (JP) ......... 2000-049553

(51) Int. Cl.$^7$ ............... C30B 15/20
(52) U.S. Cl. ............. 117/13; 117/14
(58) Field of Search ............. 117/13, 14

(56) References Cited

U.S. PATENT DOCUMENTS

| | | | | |
|---|---|---|---|---|
| 5,932,002 A | * | 8/1999 | Izumi | 117/13 |
| 5,993,539 A | * | 11/1999 | Izumi | 117/13 |
| 6,210,477 B1 | * | 4/2001 | Izumi et al. | 117/35 |
| 6,348,095 B1 | * | 2/2002 | Watanabe et al. | 117/13 |

FOREIGN PATENT DOCUMENTS

| | | |
|---|---|---|
| JP | A 4-104988 | 4/1992 |
| JP | A 4-139092 | 5/1992 |
| JP | A 10-324594 | 12/1998 |
| JP | A 11-292688 | 10/1999 |
| WO | WO 99/07922 | 2/1999 |

* cited by examiner

Primary Examiner—Felisa Hiteshew
(74) Attorney, Agent, or Firm—Oliff & Berridge, PLC

(57) ABSTRACT

The present invention provides a method for producing a silicon single crystal by the CZ method, in which a seed crystal having a pointed tip end or truncated pointed tip end shape as a shape of its tip end portion to be brought into contact with a silicon melt is used, the tip end of the seed crystal is carefully brought into contact with the silicon melt, then the seed crystal is descended at a low speed or a surface of the silicon melt is ascended at a low speed to melt the tip end portion of the seed crystal to a desired diameter, and subsequently the seed crystal is slowly ascended or the surface of the silicon melt is slowly descended to grow a silicon single crystal ingot without performing necking, wherein after the tip end of the seed crystal is carefully brought into contact with the silicon melt, the seed crystal is maintained at that state for 5 minutes or more to reserve heat in the seed crystal. Thus, there is provided a method for dislocation-free seeding, which improves a success ratio in making a crystal dislocation-free and enables safe and efficient production of single crystals having a large diameter and a heavy weight at low cost.

16 Claims, 1 Drawing Sheet ated with the silicon melt for use to make the

METHOD FOR PRODUCING SILICON SINGLE CRYSTAL

This application is on 371 of PCT/JP01/01224 Feb. 21, 2001.

TECHNICAL FIELD

The present invention relates to a method for producing a silicon single crystal by the Czochralski method (CZ method).

BACKGROUND ART

In the conventional production of silicon single crystal by the CZ method, a single crystal silicon is used as a seed crystal, and it is brought into contact with a silicon melt for seeding and slowly pulled with rotation to grow a single crystal ingot. In this operation, after the seed crystal is brought into contact with the silicon melt, the so-called necking is performed, in which the diameter of the single crystal is once decreased to about 3 mm to form a neck portion, in order to eliminate dislocations produced by propagation of slip dislocations generated in the seed crystal at a high density by thermal shock, and then the diameter of the crystal is increased to a desired diameter to pull a dislocation-free silicon single crystal. Such necking is widely known as Dash Necking method, and considered a common sense technique in pulling of a silicon single crystal ingot by the CZ method.

A conventionally used seed crystal is, for example, in a shape of cylinder or prism having a diameter or side of about 8 to 20 mm provided with a notch for setting it on a seed holder, and it has a flat surface for the bottom end, which is first brought into contact with the silicon melt. Because it must bear a large weight of the crystal ingot to pull it safely, it is difficult to further decrease the diameter of the seed crystal from the above-specified range in view of the strength of the material.

Since a seed crystal in such a shape has a large thermal capacity at its tip end to be brought into contact with the melt, a temperature difference is rapidly generated in the crystal at the instant of contact of the seed crystal with the melt and thus slip dislocations are generated at a high density. Therefore, the aforementioned necking becomes necessary in order to grow a single crystal while eliminating the slip dislocations.

However, under such a condition, the crystal must be necked at least to a minimum diameter of about 3 to 5 mm in order to make it dislocation-free, even if the necking conditions are variously controlled. But, such a diameter invites insufficient strength for supporting a single crystal ingot of which weight recently becomes heavier with use of a larger diameter of silicon single crystal, and there may be caused a problem that such a neck portion having a small diameter is broken and the single crystal ingot falls during the pulling of the single crystal ingot and so forth. For example, when the neck has a diameter of 5 mm, a crystal of about 250 kg is considered the upper limit for pulling considering safety factor, and it is difficult to efficiently produce a crystal having a large diameter.

Inventions for solving such a problem are proposed in Japanese Patent Laid-open (Kokai) Nos. 4-104988, 4-139092 and so forth. In these inventions, a tapered shape is used for a tip end portion of the seed crystal to make the thermal capacity of the tip end portion of the seed crystal to be brought into contact with the melt small so that slip dislocations to be generated at the instant of contact of the seed crystal with the melt should become very few, thereby realizing substantially necking-free crystal growth.

In these methods, the necking process can be shortened and the diameter of the neck portion can be made larger. Therefore, there can be obviated the problem that the neck portion is broken and the single crystal ingot falls during the pulling of the single crystal ingot and so forth.

A problem of such seeding methods utilizing a seed crystal having a special shape of its tip end portion is their success ratio in making a crystal dislocation-free.

That is, in these methods, if making a seed crystal dislocation-free is once failed, necking must be performed by the dash necking method, or the seed crystal must be changed to a new one and pulling must be performed again. Therefore, in order to widely use the methods for industrial purpose, it is particularly important to improve the success ratio in making a crystal dislocation-free.

However, detailed seeding conditions for obtaining sufficient reproducibility are not disclosed in the aforementioned proposed inventions, and the success ratio in making a crystal dislocation-free was not necessarily at a satisfactory level.

DISCLOSURE OF THE INVENTION

Therefore, the present invention was accomplished in view of such a problem of conventional techniques, and its object is to provide a method for safely and efficiently producing a silicon single crystal having a large diameter and a heavy weight with markedly improved success ratio in making a crystal dislocation-free.

In order to achieve the aforementioned object, the method for producing a silicon single crystal according to the present invention is a method for producing a silicon single crystal by the Czochralski method, in which a seed crystal having a shape of a pointed tip end or a truncated pointed tip end as a shape of its tip end portion to be brought into contact with a silicon melt is used, the tip end of the seed crystal is first carefully brought into contact with the silicon melt, then the seed crystal is descended at a low speed or a surface of the silicon melt is ascended at a low speed to melt the tip end portion of the seed crystal to a desired diameter, and subsequently the seed crystal is slowly ascended or the surface of the silicon melt is slowly descended to grow a silicon single crystal ingot without performing necking, wherein after the tip end of the seed crystal is carefully brought into contact with the silicon melt, the seed crystal is maintained at that state for 5 minutes or more to reserve heat in the seed crystal.

If the seed crystal is maintained for 5 minutes or more after the tip end of the seed crystal is carefully brought into contact with the silicon melt to reserve heat in the seed crystal as described above, the temperature of the seed crystal is sufficiently increased and therefore probability that slip dislocations are generated in the subsequent melting process can be decreased. Thus, the success ratio in making a crystal dislocation-free can be markedly improved, and a silicon single crystal having a large diameter and a heavy weight can be safely and efficiently produced.

Further, the method for producing a silicon single crystal according to the present invention is also a method for producing a silicon single crystal by the Czochralski method, in which a seed crystal having a shape of a pointed tip end or a truncated pointed tip end as a shape of its tip end portion to be brought into contact with a silicon melt is used, the tip end of the seed crystal is first carefully brought into contact with the silicon melt, then the seed crystal is descended at a low speed or a surface of the silicon melt is ascended at a low speed to melt the tip end portion of the seed crystal to a desired diameter, and subsequently the seed crystal is slowly ascended or the surface of the silicon melt is slowly descended to grow a silicon single crystal ingot without performing necking, wherein the tip end of the seed crystal is carefully brought into contact with the silicon melt to melt the tip end portion of the seed crystal for a length of 5 mm or less, and then the seed crystal is maintained for 5 minutes or more to reserve heat in the seed crystal.

It was found that, if the tip end of the seed crystal is carefully brought into contact with the silicon melt to melt the tip end of the seed crystal for a length of 5 mm or less, and then the seed crystal is maintained at that state for 5 minutes or more as described above, the temperature of tip end portion of the seed crystal can be made approximately equal to the temperature of the silicon melt surface. Further, it was found that, since the tip end portion of the seed crystal is melt at instant of contact with the silicon melt thanks to the use of a pointed shape of the tip end so long as the melted length is 5 mm or less, slip dislocations are not generated.

In the steps of melting the tip end portion of the seed crystal to a desired diameter and then slowly ascending the seed crystal or slowly descending the silicon melt surface to grow a single crystal ingot in these methods, it is preferred that the diameter of the crystal is decreased by 0.3 mm or more but 2 mm or less from a diameter at the time when the melting is finished and then the diameter is increased within a section of at least 3 mm from the position at which the melting of the tip end portion of the seed crystal to the desired diameter is finished.

If the temperature of the silicon melt is controlled so that the diameter of the crystal is decreased by 0.3 mm or more but 2 mm or less from a diameter at the time of finishing the melting and then the diameter is increased within a section of at least 3 mm from the position at which the melting of the tip end portion of the seed crystal to the desired diameter is finished in the steps of slowly ascending the seed crystal or slowly descending the silicon melt surface to grow a single crystal as described above, the tip end portion of the seed crystal should have a temperature at which it is rapidly melted in the step of melting the seed crystal and therefore the seed crystal can be melted to the desired diameter without generating slip dislocations.

The above characteristics are employed for the following reasons. When a crystal having a large diameter and a heavy weight is produced, the amount of silicon melt in a crucible also becomes to have a heavy weight and hence a large thermal capacity and thus the temperature of the silicon melt cannot be lowered in a short period of time. Therefore, in order to increase the diameter immediately after finishing the melting, decrease of the silicon melt temperature must be started during the step of melting the seed crystal. However, when the silicon melt does not have a sufficiently high temperature, the tip end of the seed crystal cannot be rapidly melted at the melt surface and thus it sinks into the silicon melt in the state of solid. Thus, slip dislocations are generated. If the melting is performed to a sufficient diameter without generating slip dislocation by the above method, a sufficient diameter can be secured in the subsequent diameter increasing step even after the diameter is decreased by 0.3 mm or more but 2 mm or less within the section of 3 mm after the melting is finished. Thus, strength does not become insufficient even when a crystal having a large diameter and a heavy weight is produced.

Furthermore, in these methods, as for the rate of melting the tip end portion of the seed crystal to a desired diameter by descending the seed crystal at a low speed or ascending the silicon melt surface at a low speed, the descending speed of the seed crystal or the ascending speed of the silicon melt surface can be determined as a speed changing continuously or stepwise so that the volume of the tip end portion of the seed crystal melting per minute should become 50 mm$^3$ or less.

In order to melt the tip end portion of the seed crystal without generating slip dislocations, such conditions can be selected that the tip end portion of the seed crystal should be rapidly melted at the melt surface and thus it should be prevented from sinking into the silicon melt in the state of solid. However, if the conditions are adjusted only by lowering the rate of melting the tip end portion of the seed crystal, time required for the melting becomes longer. Thus, the productivity is degraded and in addition, slip dislocations may also be generated due to temperature fluctuation of the silicon melt contacting with the tip end portion of the seed crystal.

Furthermore, in these methods, a horizontal magnetic field of 1000 G or more is preferably applied to the melt surface in a crucible accommodating the silicon melt.

If a horizontal magnetic field of 1000 G or more is applied to the melt surface in the crucible accommodating the silicon melt, convection of the silicon melt is suppressed, and the generation of slip dislocations due to temperature fluctuation of the melt can be avoided. Therefore, the success ratio in making a crystal dislocation-free can be markedly improved.

As explained above, according to the present invention, a high success ratio in making a crystal dislocation-free can be attained in the dislocation-free seeding method in which seeding is performed without necking, and it enables production of dislocation-free silicon single crystals having a heavy weight with higher productivity, higher yield and lower cost compared with conventional methods.

BEST MODE FOR CARRYING OUT THE INVENTION

Figure 1:
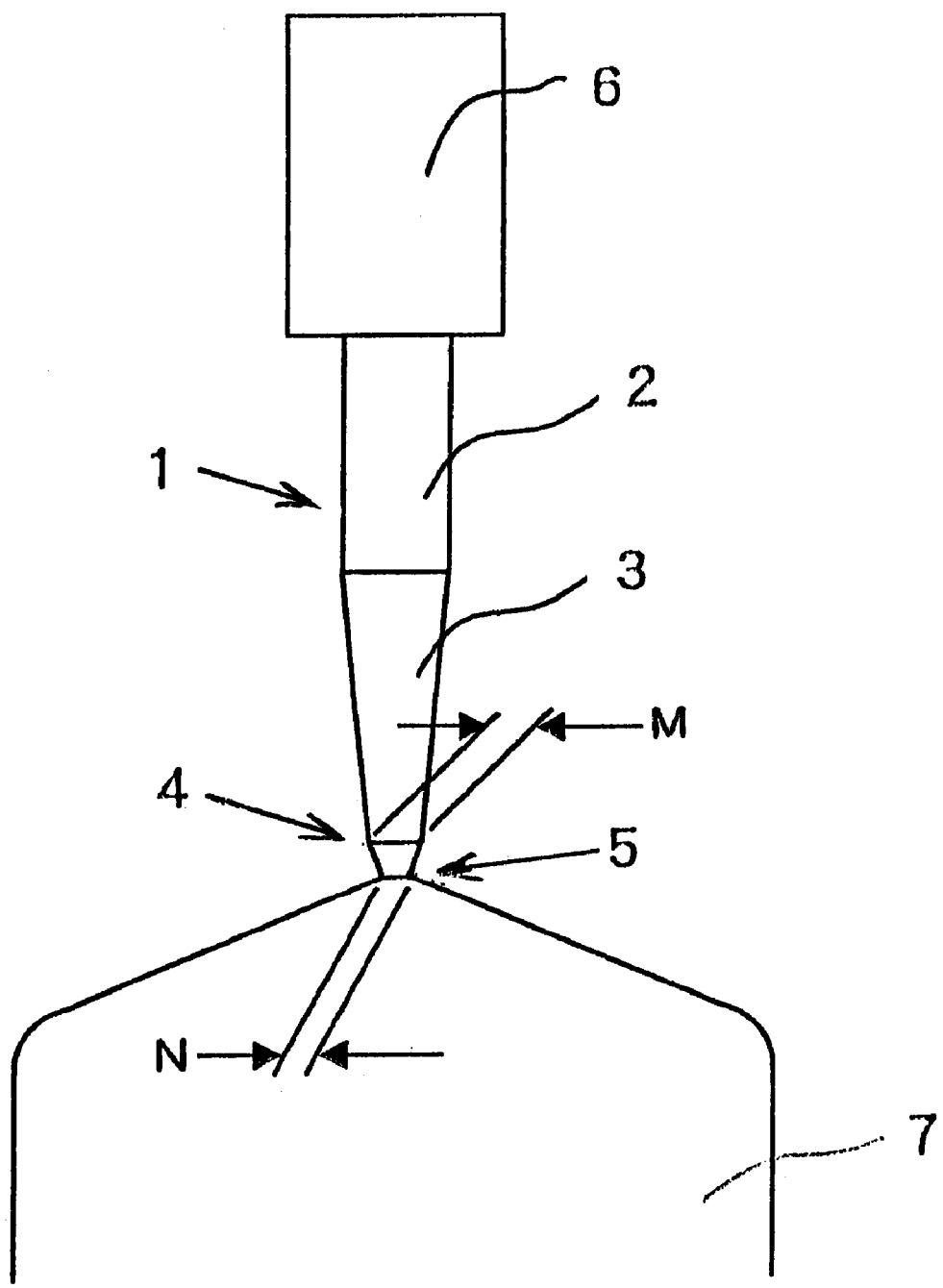
FIG. 1 is an explanatory view showing the dislocation-free seeding method of the present invention.

Hereafter, embodiments of the present invention will be explained. However, the present invention is not limited to these.

FIG. 1 is an enlarged view of the neighborhood of a seed crystal of a single crystal grown by the method of the present invention for growing a single crystal without performing necking.

When the inventors of the present invention attempted to grow a single crystal without necking by the method proposed in the aforementioned Japanese Patent Laid-open (Kokai) Publication No. 4-139092 or the like, the success ratio in making a crystal dislocation-free and reproducibility thereof might not reach a sufficiently satisfactory level. The inventors of the present invention investigated the cause of this problem and found that the method for reserving heat in the seed crystal before melting it, the melting rate of the seed crystal, time required for the melting and the like were deeply involved in the problem. Then, they precisely investigated these factors and accomplished the present invention.

In the method proposed in Japanese Patent Laid-open (Kokai) Publication No. 4-139092 or the like, it is described that "before a tapered tip end portion of a seed crystal is immersed into a silicon melt, it is held immediately above the melt for 5 minutes or more to heat the tapered tip end portion to a temperature near the melting point, and then the tapered tip end portion is immersed into the melt". However, by using any of lifting mechanisms for seed crystal using a wire or shaft, which are widely used at present, it is extremely difficult to precisely fix the position of the tip end of seed crystal.

On the other hand, temperature of the atmosphere immediately above the silicon melt surface has a temperature gradient of about 1° C./mm within the range of 50 mm from the melt surface, and about 2° C./mm within the range of 20 mm from the melt surface, although it depends on the structure of graphite members keeping the heat in the furnace. Therefore, it was considered that, if the position of the seed crystal held immediately above the melt was deviated, the temperature of the tip end portion of the seed crystal during the heat reservation was decreased and thus the success ratio in making a crystal dislocation-free was markedly decreased. Further, it is expected that the seed crystal is not heated to a sufficiently high temperature only by heat reservation at a position above the melt surface, since the seed crystal is not brought into contact with the melt once during such heat reservation and hence there is not heat reservation by heat conduction.

Thus, since a seed crystal having the shape disclosed in Japanese Patent Laid-open (Kokai) No. 10-324594 was available as a seed crystal having a pointed shape or a shape having a truncated pointed tip end, the following test was performed by using such a seed crystal.

For pulling a single crystal having a diameter of 150 mm, there was used a silicon seed crystal in a shape of square pole that a silicon seed crystal straight body had a side length of 15 mm and a tip end portion tapered into a corn shape having a vertical angle of 15°, of which surface had been etched for 200 μm or more with a mixed acid of hydrofluoric acid and nitric acid. The seed crystal was set on a seed crystal holder and the tip end of the seed crystal was brought into contact with a silicon melt. Then, the seed crystal was immediately pulled upwardly from a position above the silicon melt. And then, the seed crystal was sliced parallel to the length direction, and presence or absence of dislocation was investigated by X-ray topography. As for the operation of bringing the seed crystal into contact with the melt, the aforementioned silicon seed crystal was first descended to a position about 20 cm above the silicon melt surface at a speed of 300 mm/min, and from that position, the seed crystal was descended at a speed of 5 mm/min to perform the operation. The position at which the seed crystal was brought into contact with the silicon melt was determined by applying an alternating current between the seed crystal and the silicon melt and detecting conduction.

In this way, investigation was performed by using ten seed crystals. As a result, it was found that no slip dislocation was generated in all of the seed crystals, and, if a seed crystal in a shape having a pointed tip end was used, slip dislocation was not generated only by bringing the seed crystal into contact with the melt surface, even though there was not performed heat reservation by stopping the seed crystal above the melt surface. Further, when investigation was also performed for seed crystals in a shape having a truncated pointed tip end, similar results were obtained.

In this case, since the tip end portion of the seed crystal was brought into contact with the silicon melt and quickly melted, it was no longer in contact with the silicon melt after the descent of the seed crystal was stopped, and a state that the tip end portion of the seed crystal was separated from the silicon melt was immediately attained. Therefore, experiments were performed by changing the distance for which the seed crystal was further descended from the position at which the tip end portion of the seed crystal was brought into contact with the silicon melt (length for which the seed crystal was immersed) from 0.5 mm to 10 mm at an interval of 0.5 mm to observe the contacting condition of the tip end portion of the seed crystal and the silicon melt. As a result, when the length for immersing the seed crystal into the silicon melt after the tip end portion was brought into contact with the silicon melt was 5.5 mm or longer, the tip end portion of the seed crystal and the silicon melt were still in contact with each other in all of the cases even after the descent of the seed crystal was stopped. Further, when these seed crystals were sliced and then slip dislocation was observed by X-ray topography in the same manner as described above, if the length for immersing the seed crystal into the melt after the tip end portion was brought into contact with the silicon melt was 5.0 mm or shorter, dislocation was not observed in all of the cases, and if the distance was 5.5 mm or longer, dislocations were observed in all of the cases.

Based on the above results, factors for performing dislocation-free seeding were selected, and researches and experiments were repeated in order to establish conditions for making dislocation-free.

As shown in Table 1, the investigated factors were (A) the distance between the tip end portion of the seed crystal and the silicon melt surface during heat reservation before the seed crystal is brought into contact with the silicon melt or (B) the length of the seed crystal melted in the first stage seed crystal melting step for further melting the tip end portion of the seed crystal after the tip end portion of the seed crystal is brought into contact with the silicon melt, (C) heat reservation time for heat reservation of the seed crystal before the seed crystal is brought into contact with the silicon melt or heat reservation of the seed crystal after the first stage seed crystal melting step is finished and melting is stopped, (D) melting rate of the seed crystal in the seed crystal tip end melting step after the heat reservation of the seed crystal is completed, (E) difference of the diameter M of the seed crystal tip end after the melting is completed and the minimum diameter N in a section where the diameter is increased to a desired diameter (hereinafter, also referred to as "diameter after decrease of diameter") in the step of pulling the seed crystal after the melting of the seed crystal is completed (also referred to as diameter decreasing width), and (F) magnetic field intensity applied to the melt surface in a crucible accommodating the silicon melt during dislocation-free seeding.

The magnetic field intensity (F) used herein indicates a value of magnetic field intensity observed at an interface at which the tip end portion of the seed crystal and the melt surface are contacted, when a horizontal magnetic field is applied to the silicon melt in the crucible.

A state of the seed crystal during the growth of a silicon crystal pulled in the manner described above is shown in FIG. 1.

As a silicon seed crystal 1, there was used a silicon seed crystal in a shape of square pole that a silicon seed crystal straight body 2 had a side length of 15 mm and a silicon seed crystal tip end portion 3 tapered into a corn shape having a vertical angle of 15°, of which surface had been etched for 200 μm or more with a mixed acid of hydrofluoric acid and nitric acid. The seed crystal was set on a seed crystal holder 6 and a single crystal ingot 7 having a diameter of 150 mm was grown to investigate the success ratio in making a crystal dislocation-free.

As for the operation for performing dislocation-free seeding, the aforementioned silicon seed crystal 1 was first approached to the silicon melt at a speed of 5 mm/min and the seed crystal was maintained at a position where the distance between the silicon seed crystal tip end and the silicon melt surface became A mm to perform heat reservation for C minutes, or without performing this operation, the silicon seed crystal was approached to the silicon melt at a speed of 5 mm/min so that the tip end portion of the seed crystal should be directly brought into contact with the melt surface to melt the seed crystal tip end portion for a length of B mm (B may be 0 mm), and then the melting was stopped to perform heat reservation for C minutes. Then, the tip end portion of the seed crystal is melt at a rate of D mm$^3$/min. Thereafter, in the step where the seed crystal is pulled upwardly to grow a single crystal at a rate of 0.1 to 1.5 mm/min, the diameter is decreased by E mm from the diameter M of the melting completed portion 4 at the time of the completion of melting (diameter of the decreased diameter portion 5 after diameter decreasing is N), and then the single crystal ingot is pulled at a predetermined single crystal growing rate with increasing the diameter. In this experiment, the diameter M of the melting completed portion 4 of the seed crystal was set to be 8 mm.

Further, in this operation, a horizontal magnetic field was applied so that the magnetic field intensity at the interface where the melt surface and the seed crystal in the crucible accommodating the silicon melt are contacted with each other should become F gauss.

The success ratios in making a crystal dislocation-free of the crystals in the growth of the silicon single crystals pulled as described above are shown in Table 1. The success ratio in making a crystal dislocation-free used herein is a value representing a ratio of the number of single crystal ingots not suffering form generation of dislocation to the number of the pulled single crystal ingots in terms of percentage.

TABLE 1

| Test No. | Item | | | | | | Ratio in making dislocation-free (%) |
|---|---|---|---|---|---|---|---|
| | A | B | C | D | E | F | |
| 1 | 5.0 | — | 10 | 50 | 0.9 | 3000 | 5 |
| 2 | 1.0 | — | 10 | 50 | 1.2 | 3000 | 10 |
| 3 | — | 0 | 10 | 50 | 1.1 | 3000 | 50 |
| 4 | — | 3 | 10 | 50 | 1.2 | 3000 | 60 |
| 5 | — | 5 | 20 | 50 | 1.1 | 3000 | 80 |
| 6 | — | 3 | 5 | 50 | 0.3 | 3000 | 70 |
| 7 | — | 3 | 20 | 50 | 0.0 | 3000 | 40 |
| 8 | — | 3 | 20 | 80 | 0.6 | 3000 | 10 |
| 9 | — | 3 | 0 | 50 | 0.7 | 3000 | 20 |
| 10 | — | 3 | 20 | 150 | 0.6 | 3000 | 0 |
| 11 | — | 5 | 10 | 30 | 1.1 | 3000 | 85 |
| 12 | — | 5 | 10 | 50 | 0.9 | 3000 | 90 |
| 13 | — | 5 | 10 | 60 | 0.9 | 3000 | 50 |
| 14 | — | 5 | 10 | 50 | 1.0 | 1000 | 70 |
| 15 | — | 5 | 10 | 50 | 1.1 | 0 | 50 |
| 16 | — | 8 | 10 | 50 | 1.0 | 3000 | 0 |

A Distance between melt surface and position of tip end portion of seed crystal subjected to heat reservation (mm)
B Length of seed crystal tip end portion melted in first stage (mm)
C Heat reservation time of seed crystal (minute)
D Melting rate of seed crystal (mm$^3$/min)
E Diameter decreasing width (mm)
F Magnetic field intensity (G, gauss)

From the results shown in the above table, it was found that there were the following relationships between the seeding factors A to F and the success ratio in making a crystal dislocation-free.

(1) The distance A between the silicon seed crystal tip end and the silicon melt surface before melting the silicon seed crystal tip end is preferably made small as much as possible. However, heat reservation above the melt surface cannot be expected to provide improvement of the success ratio in making a crystal dislocation-free. That is, it is considered that this is because, if this distance becomes large, the temperature of the tip end portion of the seed crystal is not sufficiently elevated due to the temperature gradient occurred immediately above the melt surface, thus the temperature difference with respect to the melt is not eliminated, and therefore the possibility that slip dislocation are generated in the melting step is markedly increased.

In this respect, the heat reservation is further preferably performed at such a position that the tip end portion of the seed crystal should be in contact with the silicon melt surface. Since a seed crystal in a shape having a pointed tip end is used, the tip end portion is immediately melted and slip dislocations are not generated when the tip end portion is brought into contact with the melt. Further, the temperature of the seed crystal can be elevated to a sufficiently high temperature and therefore it becomes possible to reduce the possibility of the generation of slip dislocations in the seed crystal melting step following the heat reservation.

This means that the conventionally performed preheating of the seed crystal is not required to be performed before the seed crystal is brought into contact with the melt surface. Thus, the present invention also enables acceleration of the process by eliminating such a preheating step before the seed crystal is brought into contact with the melt.

(2) The length B for which the tip end portion of the silicon seed crystal is brought into contact with the silicon melt surface and further the tip end portion of the silicon seed crystal is melted is preferably made 5 mm or shorter. Further, the time C for holding the seed crystal to subject it to the heat reservation at that position is preferably 5 minutes or longer. In such a way, the tip end portion of the seed crystal is brought to a sufficiently high temperature, and thus the possibility of the generation of slip dislocations in the seed crystal tip end portion melting step following the heat reservation can be markedly reduced.

However, there is not provided a significant difference in the obtained effect even if the time for holding the seed crystal is prolonged more than required, and the holding time is suitably about 30 minutes at most. If the seed crystal is held for a time in the range of 5 to 60 minutes after the seed crystal is brought into contact with the melt, a single crystal can be efficiently produced without reducing the productivity.

(3) It is preferred that, within a section of at least 3 mm after the melting of the tip end portion of the silicon seed crystal is finished in the step of growing a single crystal ingot after the tip end portion of the silicon seed crystal is melted to a desired diameter, the diameter decreasing width E of the seed crystal from the diameter at the time of finishing the melting should be 0.3 mm or more but 2.0 mm or less. In order to increase the diameter immediately after the tip end portion of the silicon seed crystal is melted to a desired diameter, it is necessary to decrease the temperature of the silicon melt to a temperature near the melting point at the time of finishing the melting of the seed crystal, but it is difficult to decrease the temperature in a short period of time because the silicon melt has a large heat capacity.

However, if the temperature of the silicon melt is at a temperature near the melting point, the tip end portion of the seed crystal is not quickly melted in the melting step of the seed crystal, and it sinks into the silicon melt as solid and thus slip dislocations are generated in the seed crystal. In order to melt the tip end portion of the seed crystal while avoiding such generation of slip dislocations, it is necessary that the temperature at a position near the surface of the silicon melt should be made to be higher than the melting point of silicon at the time of melting the seed crystal. As a result, the crystal will be grown with a decreased diameter during the early stage in which the seed crystal is pulled after the melting of the tip end portion of the seed crystal is finished.

It is extremely difficult to measure suitable temperature during the diameter decreasing process with a thermometer or the like from the outside of a single crystal growing furnace with good reproducibility. However, according to the present invention, it was found that an optimum temperature could be determined based on shape of a single crystal ingot from a position at which the melting of the tip end portion of the seed crystal is finished to a portion having an increasing diameter.

That is, if the temperature of the silicon melt at the time of starting the melting of the tip end portion of the seed crystal is controlled so that the decreasing width E of the diameter of the single crystal ingot should become 0.3 mm or more within a section of 3 mm from the position at which the melting of the tip end portion of the seed crystal is finished, generation of slip dislocations during the melting can be substantially eliminated. However, if the width of the diameter decrease is made unduly large, the diameter of the tip end portion of the seed crystal at the time of the completion of the melting must be made extremely large in pulling a single crystal having a heavy weight. As a result, the amount of the seed crystal to be melted is increased and the possibility of generation of slip dislocation is increased. Therefore, it is preferably made about 2.0 mm or less.

(4) In the operation of melting the tip end portion of the seed crystal into the melt, as for the melting rate D, the descending speed of the seed crystal or ascending speed of the silicon melt surface can be determined as a speed changing continuously or stepwise so that the volume of the tip end portion of the seed crystal melted per minute should become 50 mm$^3$ or less.

In order to melt the tip end portion of the silicon seed crystal into the melt without generating slip dislocations, it is important that the tip end portion of the seed crystal is quickly melted at the melt surface, and does not sink into the melt in the state of solid. However, if only the melting rate is decreased for that purpose, the tip end portion of the seed crystal can be prevented from sinking into the melt in the state of solid, but the time required for the melting is prolonged. Thus, the productivity is decreased and cost is increased. In addition, slip dislocations may be generated due to temperature fluctuation of the melt that is in contact with the tip end portion of the seed crystal. Therefore, it is important that the operation of melting the tip end portion of the silicon seed crystal into the melt should be performed within a period as short as possible, and the success ratio in making a crystal dislocation-free becomes high when the volume of the tip end portion of the seed crystal melted per minute is 50 mm$^3$ or less. However, if the melting rate becomes unduly slow, the productivity may be degraded, and slip dislocations become likely to be generated due to influence of the temperature fluctuation of the melt. Therefore, the melting rate D is preferably 20 mm$^3$/min or more.

(5) In order to melt the silicon seed crystal in the melt without generating slip dislocations, it is preferred that a horizontal magnetic field is applied so that a magnetic field intensity F of 1000 gausses or more should be obtained at the interface at which the melt surface in the crucible accommodating the silicon melt and the seed crystal are in contact with each other. By applying a magnetic field to the silicon melt, thermal convection of the melt, in particular, convection of the melt around the seed crystal is suppressed, and therefore temporal variation of the temperature around the melt surface is markedly reduced.

As described above, in order to melt the silicon seed crystal into the melt without generating slip dislocations, it is important that the tip end portion of the seed crystal should be quickly melted at the melt surface, and should not sink into the melt in the state of solid. To this end, it is necessary to obtain a high temperature of the silicon melt and decrease the rate of melting the silicon seed crystal to some extent. In this case, there may arise a problem that slip dislocations may be generated due to temperature fluctuation of the melt in contact with the tip end portion of the seed crystal. However, by applying a magnetic field to the silicon melt so that a magnetic field intensity F of 1000 gausses or more should be obtained at the melt surface in the crucible accommodating the silicon melt, thermal convection of the melt, in particular, convection of melt around the seed crystal is suppressed, and therefore temporal variation of the temperature near the melt surface is markedly reduced. Thus, it becomes possible to markedly reduce the possibility that slip dislocations are generated during the melting of the tip end portion of the seed crystal.

The present invention is not limited to the embodiments described above. The above-described embodiments are mere examples, and any of those having the substantially same structure as that described in the appended claims and providing the similar functions and advantages are included in the scope of the present invention.

For example, while the present invention was explained with reference to the example in which a silicon single crystal having a diameter of 6 inches (150 mm) was grown in the aforementioned embodiment, the present invention is not limited to such a case and can be applied to a silicon single crystal having a diameter of 8 to 16 inches or more, so long as a seed crystal in a shape having a pointed tip end or a truncated pointed tip end is used and the seeding conditions according to the present invention are used to perform the seeding and pull a single crystal.

Further, while the example was mentioned in which a horizontal magnetic field was applied as the magnetic field applied to the silicon melt, the present invention is not limited to such a case, and a vertical magnetic field or cusp magnetic field having an effect of suppressing convection of the silicon melt can of course be used for the present invention.

What is claimed is:

1. A method for producing a silicon single crystal by the Czochralski method, in which a seed crystal having a shape of a pointed tip end or a truncated pointed tip end as a shape of its tip end portion to be brought into contact with a silicon melt is used, the tip end of the seed crystal is first carefully brought into contact with the silicon melt, then the seed crystal is descended at a low speed or a surface of the silicon melt is ascended at a low speed to melt the tip end portion of the seed crystal to a first diameter, and subsequently the seed crystal is slowly ascended or the surface of the silicon melt is slowly descended to grow a silicon single crystal ingot without performing necking, wherein after the tip end of the seed crystal is carefully brought into contact with the silicon melt, the seed crystal is maintained at that state for 5 minutes or more to reserve heat in the seed crystal.

2. The method for producing a silicon single crystal according to claim 1, wherein, in the steps of melting the tip end portion of the seed crystal to a first diameter and then slowly ascending the seed crystal or slowly descending the silicon melt surface to grow a single crystal ingot, the diameter of the crystal is decreased by 0.3 mm or more but 2 mm or less from a diameter at the time when the melting is finished and then the diameter is increased within a section of at least 3 mm from the position at which the melting of the tip end portion of the seed crystal to the first diameter is finished.

3. The method for producing a silicon single crystal according to claim 2, wherein, as for the rate of melting the tip end portion of the seed crystal to a first diameter by descending the seed crystal at a low speed or ascending the silicon melt surface at a low speed, the descending speed of the seed crystal or the ascending speed of the silicon melt surface is determined as a speed changing continuously or stepwise so that the volume of the tip end portion of the seed crystal melting per minute should become 50 mm$^3$ or less.

4. The method for producing a silicon single crystal according to of claim 3, wherein a horizontal magnetic field of 1000 G or more is applied to the melt surface in a crucible accommodating the silicon melt.

5. The method for producing a silicon single crystal according to of claim 2, wherein a horizontal magnetic field of 1000 G or more is applied to the melt surface in a crucible accommodating the silicon melt.

6. The method for producing a silicon single crystal according to claim 1, wherein, as for the rate of melting the tip end portion of the seed crystal to a first diameter by descending the seed crystal at a low speed or ascending the silicon melt surface at a low speed, the descending speed of the seed crystal or the ascending speed of the silicon melt surface is determined as a speed changing continuously or stepwise so that the volume of the tip end portion of the seed crystal melting per minute should become 50 mm$^3$ or less.

7. The method for producing a silicon single crystal according to of claim 6, wherein a horizontal magnetic field of 1000 G or more is applied to the melt surface in a crucible accommodating the silicon melt.

8. The method for producing a silicon single crystal according to of claim 1, wherein a horizontal magnetic field of 1000 G or more is applied to the melt surface in a crucible accommodating the silicon melt.

9. A method for producing a silicon single crystal by the Czochralski method, in which a seed crystal having a shape of a pointed tip end or a truncated pointed tip end as a shape of its tip end portion to be brought into contact with a silicon melt is used, the tip end of the seed crystal is first carefully brought into contact with the silicon melt, then the seed crystal is descended at a low speed or a surface of the silicon melt is ascended at a low speed to melt the tip end portion of the seed crystal to a first diameter, and subsequently the seed crystal is slowly ascended or the surface of the silicon melt is slowly descended to grow a silicon single crystal ingot without performing necking, wherein the tip end of the seed crystal is carefully brought into contact with the silicon melt to melt the tip end portion of the seed crystal for a length of 5 mm or less, and then the seed crystal is maintained for 5 minutes or more to reserve heat in the seed crystal.

10. The method for producing a silicon single crystal according to claim 9, wherein, in the steps of melting the tip end portion of the seed crystal to a first diameter and then slowly ascending the seed crystal or slowly descending the silicon melt surface to grow a single crystal ingot, the diameter of the crystal is decreased by 0.3 mm or more but 2 mm or less from a diameter at the time when the melting is finished and then the diameter is increased within a section of at least 3 mm from the position at which the melting of the tip end portion of the seed crystal to the first diameter is finished.

11. The method for producing a silicon single crystal according to claim 10, wherein, as for the rate of melting the tip end portion of the seed crystal to a first diameter by descending the seed crystal at a low speed or ascending the silicon melt surface at a low speed, the descending speed of the seed crystal or the ascending speed of the silicon melt surface is determined as a speed changing continuously or stepwise so that the volume of the tip end portion of the seed crystal melting per minute should become 50 mm$^3$ or less.

12. The method for producing a silicon single crystal according to of claim 11, wherein a horizontal magnetic field of 1000 G or more is applied to the melt surface in a crucible accommodating the silicon melt.

13. The method for producing a silicon single crystal according to of claim 10, wherein a horizontal magnetic field of 1000 G or more is applied to the melt surface in a crucible accommodating the silicon melt.

14. The method for producing a silicon single crystal according to claim 9, wherein, as for the rate of melting the tip end portion of the seed crystal to a first diameter by descending the seed crystal at a low speed or ascending the silicon melt surface at a low speed, the descending speed of the seed crystal or the ascending speed of the silicon melt surface is determined as a speed changing continuously or stepwise so that the volume of the tip end portion of the seed crystal melting per minute should become 50 mm$^3$ or less.

15. The method for producing a silicon single crystal according to of claim 14, wherein a horizontal magnetic field of 1000 G or more is applied to the melt surface in a crucible accommodating the silicon melt.

16. The method for producing a silicon single crystal according to of claim 9, wherein a horizontal magnetic field of 1000 G or more is applied to the melt surface in a crucible accommodating the silicon melt.

* * * * *